(12) United States Patent
Iijima et al.

(10) Patent No.: US 9,589,974 B2
(45) Date of Patent: Mar. 7, 2017

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventors: Jun Iijima, Mie-ken (JP); Yoshiaki Himeno, Mie-ken (JP); Takamasa Usui, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/163,300

(22) Filed: Jan. 24, 2014

(65) Prior Publication Data
US 2015/0069491 A1 Mar. 12, 2015

Related U.S. Application Data

(60) Provisional application No. 61/876,254, filed on Sep. 11, 2013.

(51) Int. Cl.
*H01L 29/788* (2006.01)
*H01L 27/115* (2006.01)
*H01L 29/423* (2006.01)

(52) U.S. Cl.
CPC .............................. *H01L 27/11524* (2013.01)

(58) Field of Classification Search
USPC .......................................... 257/316; 438/586
See application file for complete search history.

(56) References Cited

U.S. PATENT DOCUMENTS

| 7,504,724 | B2 | 3/2009 | Futatsuyama | |
|---|---|---|---|---|
| 8,304,910 | B2 | 11/2012 | Koyama | |
| 2003/0111732 | A1* | 6/2003 | Goda | H01L 21/76838 257/758 |
| 2009/0039335 | A1* | 2/2009 | Terao | G11C 13/0004 257/4 |
| 2009/0289369 | A1* | 11/2009 | Fang | H01L 21/76816 257/758 |
| 2009/0302293 | A1* | 12/2009 | Morikawa | H01L 45/06 257/2 |

(Continued)

FOREIGN PATENT DOCUMENTS

JP 2006-270122 10/2006

*Primary Examiner* — Zandra Smith
*Assistant Examiner* — Lawrence Tynes, Jr.
(74) *Attorney, Agent, or Firm* — Oblon, McClelland, Maier & Neustadt, L.L.P.

(57) ABSTRACT

According to one embodiment, a nonvolatile semiconductor memory device includes: an interlayer insulating film; an element separating region separating a semiconductor layer in the memory cell region; a gate electrode provided on one of plurality of semiconductor regions in the memory cell region; a contact electrode having a sidewall in contact with the interlayer insulating film and electrically connected to the one of the plurality of semiconductor regions in the memory cell region; a first wiring layer connected to an upper end of the contact electrode in the memory cell region; and a second wiring layer in a third direction, having an upper end higher than the upper end of the contact electrode, having a lower end lower than the upper end of the contact electrode, and having a sidewall at least partly in contact with the interlayer insulating film in the peripheral region.

17 Claims, 9 Drawing Sheets

(56) References Cited

U.S. PATENT DOCUMENTS

2009/0321877 A1* 12/2009 Wang ................ H01L 27/11507
                                                        257/532
2011/0215473 A1    9/2011 Noda et al.
2012/0241978 A1    9/2012 Mino

* cited by examiner

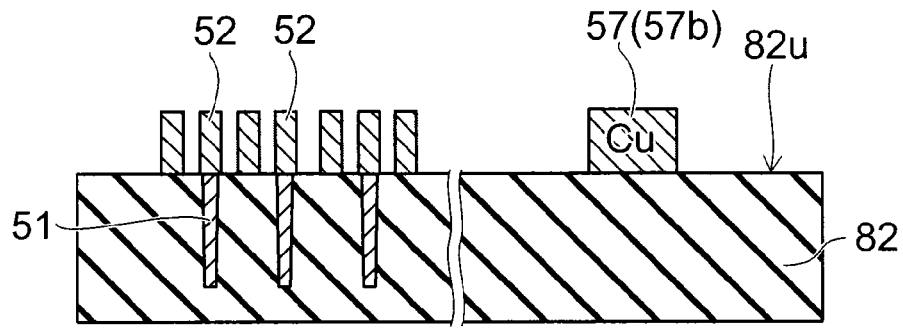
FIG. 7A
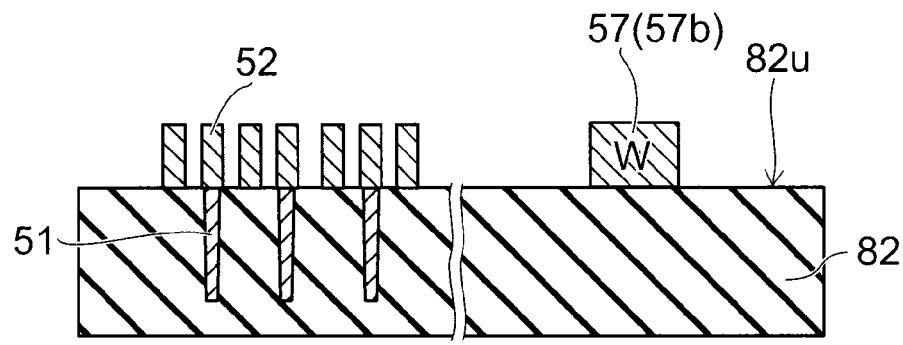
FIG. 7B
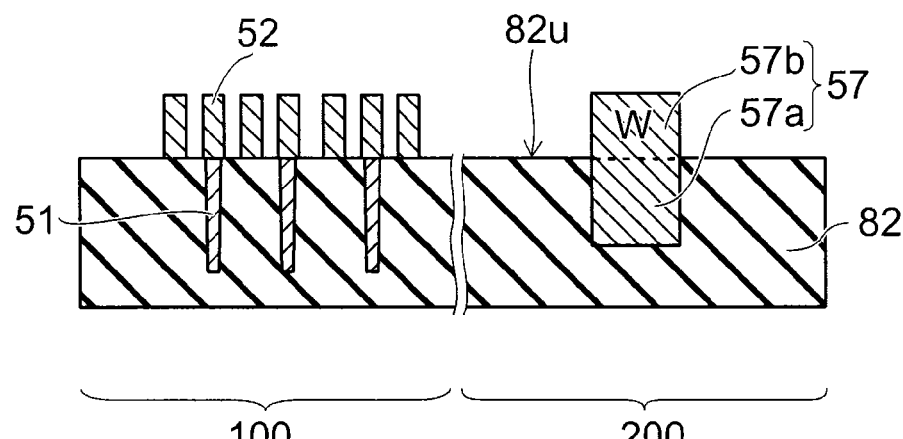
FIG. 7C
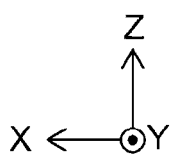

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/876,254, filed on Sep. 11, 2013; the entire contents of which are incorporated herein by reference.

FIELD

Embodiments described herein relate generally to a nonvolatile semiconductor memory device and a method for manufacturing the same.

BACKGROUND

In a nonvolatile semiconductor memory device in which a plurality of NAND memory strings are arranged, miniaturization has been increasingly advanced. With this miniaturization, the miniaturization of wirings routed in the nonvolatile semiconductor memory device has been also advanced. The miniaturization of wirings causes the problem of increased wiring resistance.

BRIEF DESCRIPTION OF THE DRAWINGS

FIGS. 7A to 7C describe the effect of the nonvolatile semiconductor memory device according to the first embodiment.

DETAILED DESCRIPTION

Figure 1:
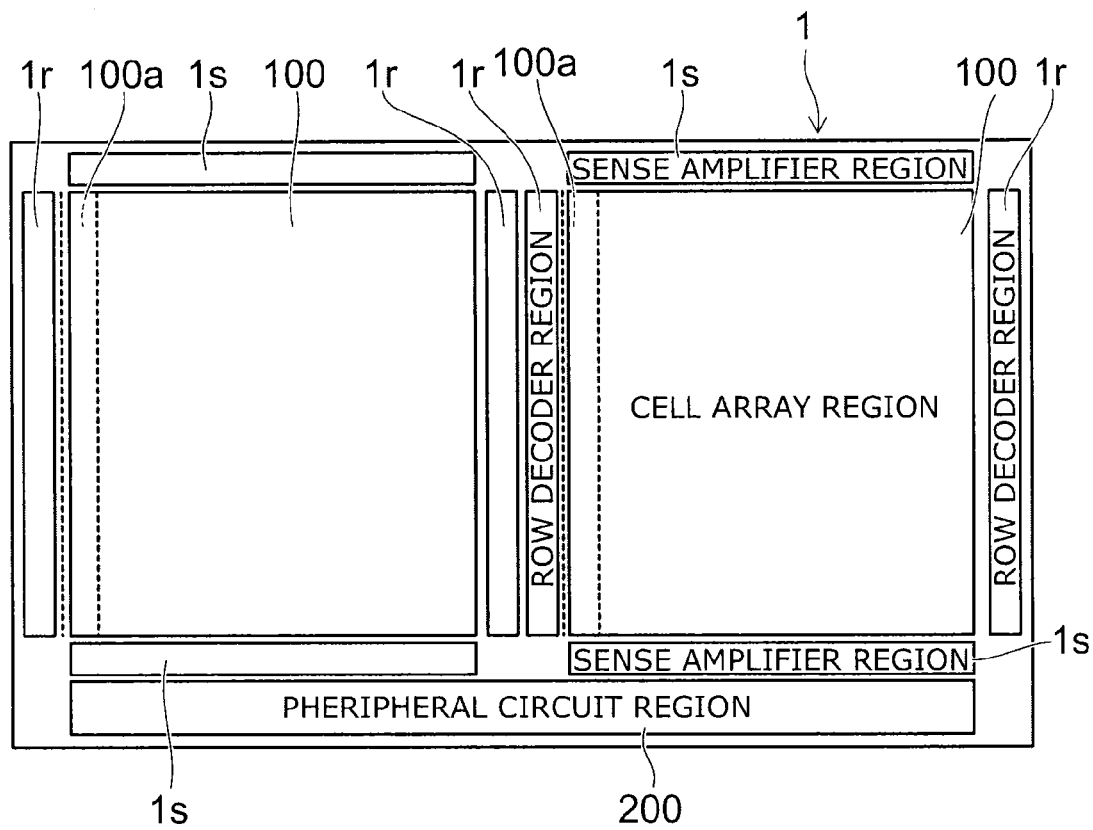
FIG. 1 is a layout diagram showing a nonvolatile semiconductor memory device according to a first embodiment.

In general, according to one embodiment, a nonvolatile semiconductor memory device includes: a semiconductor layer provided in a memory cell region and a peripheral region at a periphery of the memory cell region; an interlayer insulating film provided above the semiconductor layer; an element separating region separating the semiconductor layer into a plurality of semiconductor regions in the memory cell region; a gate electrode provided on one of the plurality of semiconductor regions via a gate insulating film in the memory cell region; a contact electrode extending in a first direction from the semiconductor layer toward the interlayer insulating film, the contact electrode having a sidewall in contact with the interlayer insulating film, and the contact electrode being electrically connected to the one of the plurality of semiconductor regions in the memory cell region; a first wiring layer connected to an upper end of the contact electrode, and the first wiring layer extending in a second direction crossing the first direction in the memory cell region; and a second wiring layer extending in a third direction crossing the first direction, the second wiring layer having an upper end higher than the upper end of the contact electrode, the second wiring layer having a lower end lower than the upper end of the contact electrode, and the second wiring layer having a sidewall at least partly in contact with the interlayer insulating film in the peripheral region.

Embodiments will now be described with reference to the drawings. In the following description, like members are labeled with like reference numerals. The description of the members once described is omitted appropriately.

First Embodiment

FIG. 1 is a layout diagram showing a nonvolatile semiconductor memory device according to a first embodiment.

The nonvolatile semiconductor memory device 1 includes a NAND flash memory. The nonvolatile semiconductor memory device 1 includes a memory cell region 100 and a peripheral region 200 placed at a periphery of the memory cell region 100.

In the nonvolatile semiconductor memory device 1, the memory cell region 100, a row-direction end region 100a of the memory cell region 100, a sense amplifier region 1s, a row decoder region 1r, and the peripheral region 200 are placed. In the embodiment, the sense amplifier region 1s, the row decoder region 1r, a mark region, the peripheral region 200 shown in FIG. 1, and the peripheral part of the nonvolatile memory device 1 are often collectively referred to as peripheral region. In the memory cell region 100, memory strings are arranged in a matrix. In the memory string, a plurality of nonvolatile memory cell transistors are series connected. At both ends of the column of the series connection, select gate transistors are connected.

The peripheral region 200 is provided with e.g. a circuit for driving and controlling the circuit placed in the memory cell region 100. For instance, the peripheral region 200 is provided with transistors, resistors, capacitors, wirings, contact plugs and the like constituting the circuit.

Figure 2:
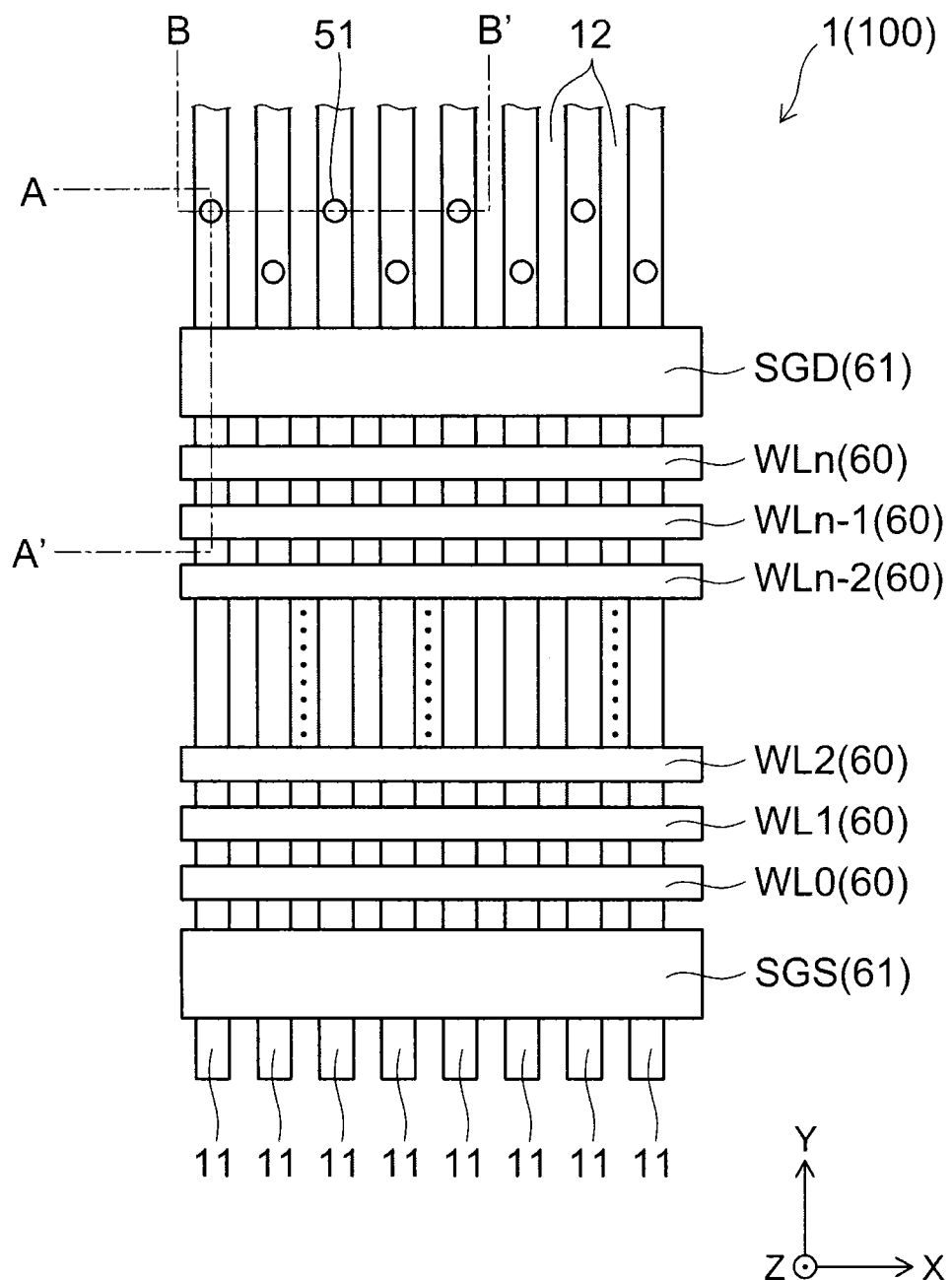
FIG. 2 is a schematic plan view showing the pattern layout of the memory cell region of the nonvolatile semiconductor memory device according to the first embodiment.

Part of the memory cell region 100 of the nonvolatile semiconductor memory device 1 is shown in FIG. 2.

FIG. 2 is a schematic plan view showing the pattern layout of the memory cell region of the nonvolatile semiconductor memory device according to the first embodiment.

In the memory cell region 100, a plurality of semiconductor regions 11 (element regions) are arranged in the X-direction. Element separating regions 12 are each provided between the plurality of semiconductor regions 11. The element separating region 12 separates the semiconductor layer 10, which is described later, into a plurality of semiconductor regions 11. A line-shaped control gate electrode 60 and a line-shaped select gate electrode 61 are provided in the X-direction crossing the Y-direction in which the semiconductor regions 11 extend. In the memory cell region 100, the select gate electrode 61 is provided on one of the plurality of semiconductor regions via a gate insulating film 20 (described later). The select gate electrodes 61 include a drain-side select gate electrode SGD and a source-side select gate electrode SGS. A plurality of control gate electrodes 60 (control gate electrodes WL0-WLn) are sandwiched between the select gate electrode SGD and the select gate electrode SGS.

The memory cell region 100 includes memory cells at the crossing positions of the plurality of semiconductor regions 11 and the plurality of control gate electrodes 60. The semiconductor region 11 sandwiched between the select gate electrode SGD and the select gate electrode SGS is provided with a plurality of memory cells. The memory cell region 100 includes a memory string in which the select gate electrode SGD, a plurality of memory cells, and the select gate electrode SGS are connected in series in the Y-direction.

Figures 3A, 3B:
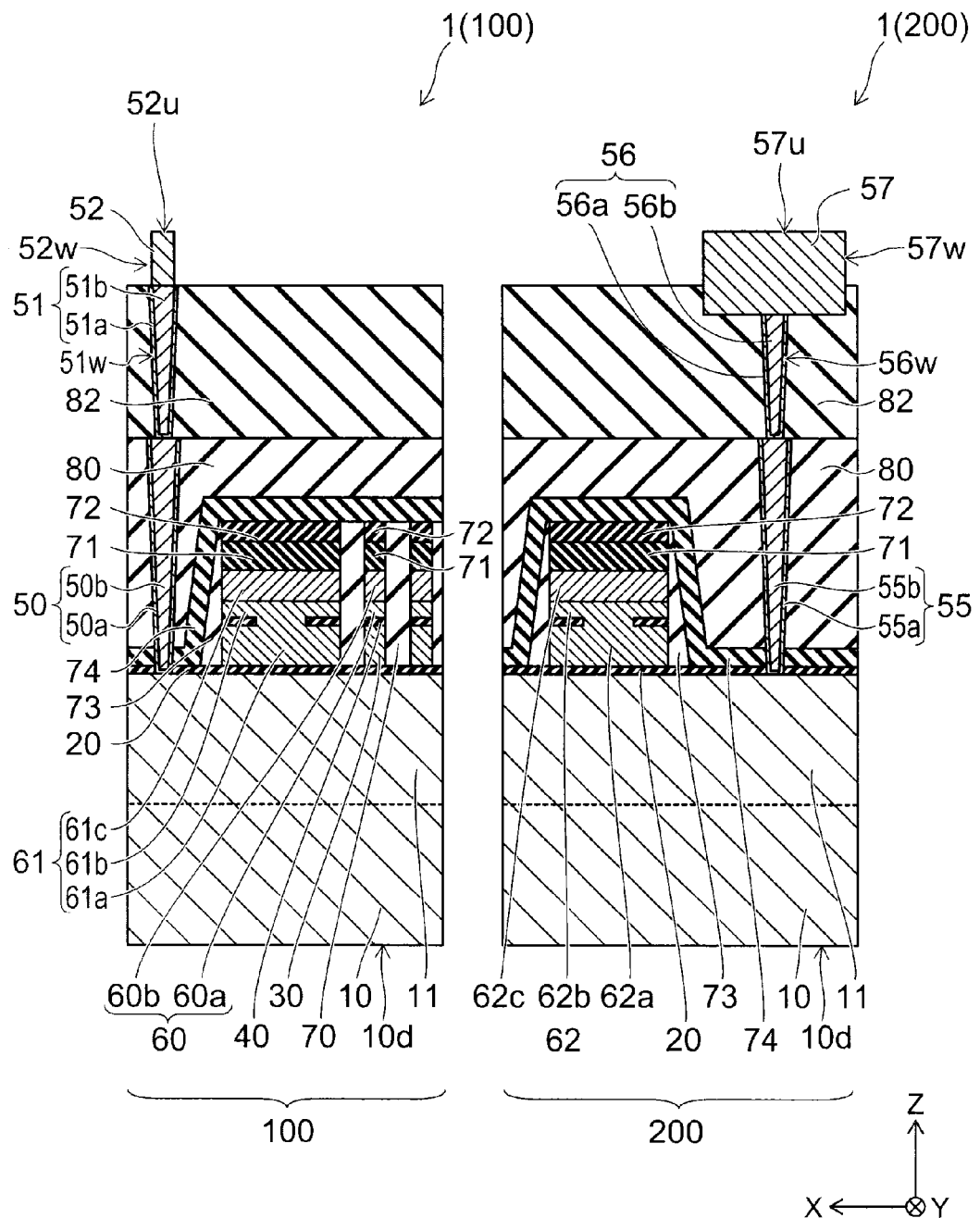
FIG. 3A is a schematic sectional view showing the select gate electrode, the control gate electrode, and the upper wiring of the memory cell region according to the first embodiment.
FIG. 3B is a schematic sectional view showing the gate electrode and the upper wiring of the peripheral region according to the first embodiment.

FIG. 3A is a schematic sectional view showing the select gate electrode, the control gate electrode, and the upper wiring of the memory cell region according to the first embodiment. FIG. 3B is a schematic sectional view showing the gate electrode and the upper wiring of the peripheral region according to the first embodiment. Here, FIG. 3A shows a cross section at the position taken along line A-A' of FIG. 2. FIG. 3B shows e.g. a cross section in one of the aforementioned peripheral regions, or a cross section in the peripheral region of a wafer substrate.

The memory cell region 100 of the nonvolatile semiconductor memory device 1 shown in FIG. 3A includes a semiconductor layer 10, a semiconductor region 11, a control gate electrode 60, a select gate electrodes 61, a gate insulating film 20, a charge accumulation layer 30, and a gate insulating film 40. In the nonvolatile semiconductor memory device 1, the semiconductor region 11, the gate insulating film 20, the charge accumulation layer 30, and the gate insulating film 40 are provided at the crossing position of the semiconductor region 11 and the control gate electrode 60. The cell, which includes the gate insulating film 20, the charge accumulation layer 30, the gate insulating film 40, and the control gate electrode 60, is referred to as e.g. memory cell in the memory cell region 100.

The semiconductor layer 10 is e.g. a semiconductor substrate singulated from a semiconductor wafer. The semiconductor region 11 on the semiconductor layer 10 is an active region populated with transistors of the nonvolatile semiconductor memory device 1. A diffusion region (source/drain region) is provided (not shown) in the surface layer of the semiconductor region 11 on both sides of the charge accumulation layer 30. The semiconductor layer 10 is provided in the memory cell region 100 and the peripheral region 200.

The gate insulating film 20 is provided between the charge accumulation layer 30 and the semiconductor region 11. The gate insulating film 20 functions as a tunnel insulating film for tunneling charge (e.g., electrons) between the semiconductor region 11 and the charge accumulation layer 30.

The charge accumulation layer 30 is provided at the crossing position of the semiconductor region 11 and the control gate electrode 60. The charge accumulation layer 30 covers the gate insulating film 20. The charge accumulation layer 30 can accumulate the charge tunneled from the semiconductor region 11 via the gate insulating film 20. The charge accumulation layer 30 may be referred to as floating gate layer.

The gate insulating film 40 is provided between the charge accumulation layer 30 and the control gate electrode 60. The gate insulating film 40 covers the charge accumulation layer 30. The side surface of the charge accumulation layer 30 is covered with an interlayer insulating film 70. That is, the upper surface and the side surface of the charge accumulation layer 30 are covered with insulator so that the charge accumulated in the charge accumulation layer 30 does not leak to the control gate electrode 60. The gate insulating film 40 may be referred to as charge block layer.

The control gate electrode 60 covers the charge accumulation layer 30 via the gate insulating film 40. The control gate electrode 60 includes a polysilicon-containing layer 60a and a metal-containing layer 60b provided above the polysilicon-containing layer 60a. The control gate electrode 60 functions as a gate electrode for controlling a transistor. The control gate electrode 60 may be referred to as word line (WL).

The select gate electrode 61 includes e.g. a polysilicon-containing layer 61a, a polysilicon-containing layer 61b, and a metal-containing layer 61c. Between the polysilicon-containing layer 61a and the semiconductor region 11, the gate insulating film 20 is provided. In the surface layer of the semiconductor region 11 on both sides of the polysilicon-containing layer 61a, a diffusion region (source/drain region) is provided (not shown). The select gate electrode 61, the gate insulating film 20, and the semiconductor region 11, which are described above, constitute a select gate transistor. By the select gate transistor, one memory string is selected from among the plurality of memory strings shown in FIG. 2.

On the control gate electrode 60, insulating layers 71, 72 are provided. On the select gate electrode 61, insulating layers 71, 72 are provided. On the sidewall of the select gate electrode 61, a sidewall film 73 is provided. On the interlayer insulating film 70, on the insulating layer 72, on the sidewall film 73, and on the gate insulating film 20, an insulating layer 74 is provided.

On the insulating layer 74, an interlayer insulating film 80 is provided. In the interlayer insulating film 80, a contact electrode 50 is provided. The contact electrode 50 includes e.g. a barrier layer 50a and a conductive layer 50b. The barrier layer 50a is e.g. a titanium film, titanium nitride film or the like. The conductive layer 50b is e.g. a tungsten (W) layer. The contact electrode 50 extends in the direction (Z-direction) from the semiconductor layer 10 toward the interlayer insulating film 80. The lower end of the contact electrode 50 penetrates through the insulating layer 74 and is connected to the semiconductor region 11 provided with the select gate electrode 61. The contact electrode 50 is electrically connected to the diffusion region of the select gate transistor.

On the interlayer insulating film 80, an interlayer insulating film 82 is provided. In the interlayer insulating film 82, a contact electrode 51 is provided. The contact electrode 51 includes e.g. a barrier layer 51a and a conductive layer 51b. The barrier layer 51a is e.g. a titanium film, titanium nitride film or the like. The conductive layer 51b is e.g. a tungsten (W) layer. The contact electrode 51 extends in the direction (Z-direction) from the semiconductor layer 10 toward the interlayer insulating film 82. The sidewall 51w of the contact electrode 51 is surrounded with the interlayer insulating film 82. The contact electrode 51 is connected to the contact electrode 50. The contact electrode 51 is electrically connected to the select gate transistor of the memory cell region 100.

On the contact electrode 51, a wiring layer 52 (e.g., bit line (BL)) is provided. The wiring layer 52 is connected to the upper end of the contact electrode 51. The wiring layer 52 extends in a direction crossing the extending direction of the contact electrode 51.

The peripheral region 200 of the nonvolatile semiconductor memory device 1 shown in FIG. 3B includes a semiconductor layer 10, a semiconductor region 11, a gate electrodes 62, and a gate insulating film 20.

The semiconductor region 11 is an active region occupied with transistors of the nonvolatile semiconductor memory device 1. The gate electrode 62 includes e.g. a polysilicon-containing layer 62a, a polysilicon-containing layer 62b, and a metal-containing layer 62c. Between the polysilicon-containing layer 62a and the semiconductor region 11, the gate insulating film 20 is provided. In the surface layer of the semiconductor region 11 on both sides of the polysilicon-containing layer 62a, a diffusion region (source/drain region) is provided (not shown). The gate electrode 62, the gate insulating film 20, and the semiconductor region 11, which is described above, form a transistor in the peripheral region 200.

The element provided in the peripheral region is not limited to the transistor. For instance, the element may be a resistor or capacitor. In the embodiment, the transistor illustrated in FIG. 3B is merely an example of the element.

On the gate electrodes 62, insulating layers 71, 72 are provided. On the sidewall of the gate electrode 62, a sidewall film 73 is provided. On the interlayer insulating film 70, on the insulating layer 72, on the sidewall film 73, and on the gate insulating film 20, an insulating layer 74 is provided.

On the insulating layer 74, an interlayer insulating film 80 is provided. In the interlayer insulating film 80, a contact electrode 55 is provided. The contact electrode 55 includes e.g. a barrier layer 55a and a conductive layer 55b. The contact electrode 55 extends in the direction (Z-direction) from the semiconductor layer 10 toward the interlayer insulating film 80. The lower end of the contact electrode 55 penetrates through the insulating layer 74 and is connected to the semiconductor region 11. The contact electrode 55 is electrically connected to the diffusion region of the transistor.

On the interlayer insulating film 80, an interlayer insulating film 82 is provided. In the interlayer insulating film 82, a contact electrode 56 is provided. The contact electrode 56 includes a barrier layer 56a and a conductive layer 56b. The contact electrode 56 extends in the direction (Z-direction) from the semiconductor layer 10 toward the interlayer insulating film 82. The sidewall 56w of the contact electrode 56 is surrounded with the interlayer insulating film 82. The contact electrode 56 is connected to the contact electrode 55. The contact electrode 56 is electrically connected to the transistor of the peripheral region 200.

On the contact electrode 56, a wiring layer 57 is provided. The wiring layer 57 is a line routed in the peripheral region 200. As an example, the wiring layer 57 is connected to the upper end of the contact electrode 56. The wiring layer 57 extends in a direction crossing the extending direction of the contact electrode 56. The line width of the wiring layer 57 is wider than the line width of the wiring layer 52. Here, the line width of the wiring layer refers to the width of the wiring layer cut perpendicularly to the extending direction of the wiring layer.

Thus, on the semiconductor layer 10, elements such as transistors, capacitors, and resistors are provided. On the interlayer insulating film 82, an interlayer insulating film and a wiring layer may be further provided.

The wiring layers 52, 57 are now described in more detail.

Figure 4:
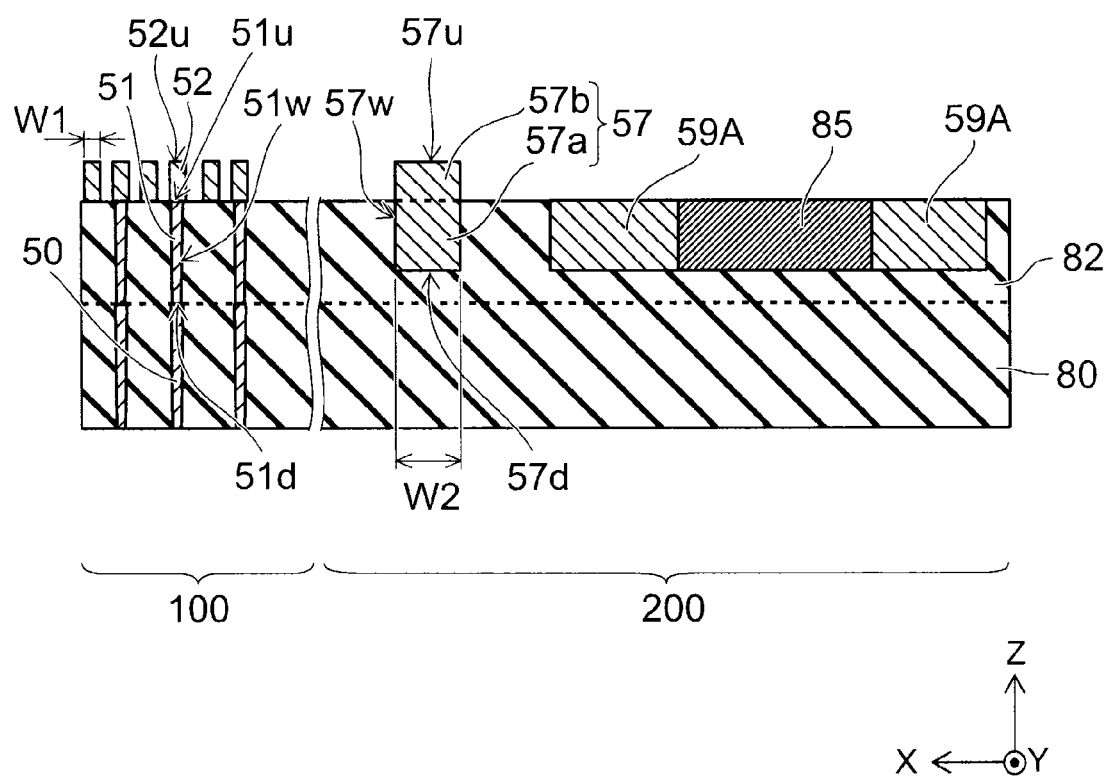
FIG. 4 is a schematic sectional view showing the upper wiring layer of the nonvolatile semiconductor memory device according to the first embodiment.

FIG. 4 is a schematic sectional view showing the upper wiring layer of the nonvolatile semiconductor memory device according to the first embodiment.

FIG. 4 shows the contact electrodes 51, 52 and the wiring layer 52 in the memory cell region 100, and the wiring layer 57 in the peripheral region 200. The memory cell region 100 illustrated in FIG. 4 shows a cross section at the position taken along line B-B' of FIG. 2.

The peripheral region 200 illustrated in FIG. 4 and the subsequent figures is a region other than the memory cell region 100. For instance, the cross section of the peripheral region 200 may be a cross section in the peripheral region collectively referred to in FIG. 1. In FIG. 4 and the subsequent figures, the memory cell region 100 and the peripheral region 200 are shown side by side. However, the cross section of the memory cell region 100 and the cross section of the peripheral region 200 shown in these figures do not necessarily need to be cross sections in the same direction. In FIG. 4 and the subsequent figures, the thin barrier layers 50a, 51 are not shown.

As shown in FIG. 4, above the semiconductor layer 10, the interlayer insulating film 80, 82 is provided.

In the memory cell region 100, the contact electrode 50 is provided in the interlayer insulating film 80, and the contact electrode 51 is provided in the interlayer insulating film 82. The contact electrode 51 extends in a first direction (Z-direction) from the semiconductor layer 10 toward the interlayer insulating film 82. The sidewall 51w of the contact electrode 51 is in contact with the interlayer insulating film 82. The contact electrode 51 is electrically connected to e.g. the select gate transistor through the contact electrode 50.

In the memory cell region 100, on the contact electrode 51, the wiring layer 52 (bit wiring) is provided. The wiring layer 52 is connected to the upper end 51u of the contact electrode 51, and extends in a second direction crossing the Z-direction. For instance, the second direction is defined as the Y-direction. The X-direction and the Y-direction in the figures are e.g. directions parallel to the major surface of the semiconductor layer 10.

In the peripheral region 200, the wiring layer 57 is provided and partly embedded in the interlayer insulating film 82. The wiring structure on the lower side of this wiring layer 57 is not shown in FIG. 4. For instance, the wiring layer 57 may be electrically connected to the element placed in the peripheral region 200, or may be in the floating state.

The wiring layer 57 extends in e.g. a third direction crossing the Z-direction. The third direction is defined as e.g. the X-direction, the Y-direction, or a direction between the X-direction and the Y-direction. The embodiment illustrates a configuration of the wiring layer 57 extending in the Y-direction. However, this is illustrative only. The wiring layer 57 may be parallel to, or cross, the wiring layer 52. The upper end 57u of the wiring layer 57 is higher than the upper end 51u of the contact electrode 51. The lower end 57d of the wiring layer 57 is lower than the upper end 51u of the contact electrode 51. At least part of the sidewall 57w of the wiring layer 57 is in contact with the interlayer insulating film 82.

The height of the upper end 52u of the wiring layer 52 from the semiconductor layer 10 is equal to the height of the upper end 57u of the wiring layer 57 from the semiconductor layer 10. The lower end 57d of the wiring layer 57 is located between the upper end 51u of the contact electrode 51 and the lower end 51d of the contact electrode 51. The width W1 of the wiring layer 52 cut perpendicularly to the Y-direction is narrower than the width W2 of the wiring layer 57 cut perpendicularly to the Y-direction.

A mark 85 is placed in e.g. a region other than the memory cell region 100 and other than the region populated with the peripheral circuit. For instance, the mark may be placed at the outermost periphery of the nonvolatile semiconductor memory device. In the embodiment, the mark region provided with the mark 85 and the region provided with the peripheral circuit are collectively referred to as peripheral region 200. The mark 85 is a mark for alignment used in the photolithography process. Around the mark 85, a conductive layer 59A is provided.

The material of the interlayer insulating film 80, 82 is e.g. silicon oxide ($SiO_2$).

The material of the wiring layer 52, 57 and the mark 85 is e.g. tungsten (W).

A process for manufacturing the nonvolatile semiconductor memory device 1 is now described.

FIGS. 5A to 6C are schematic sectional views showing the process for manufacturing a nonvolatile semiconductor memory device according to the first embodiment.

Figure 5A:
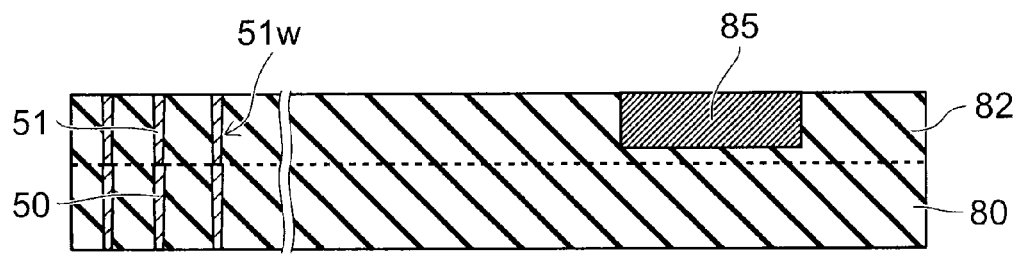
FIGS. 5A to 6C are schematic sectional views showing the process for manufacturing a nonvolatile semiconductor memory device according to the first embodiment.

First, as shown in FIG. 5A, an interlayer insulating film 80, 82 is formed above a semiconductor layer 10 provided in a memory cell region 100 and a peripheral region 200.

Subsequently, in the memory cell region 100, a contact electrode 50 is formed in the interlayer insulating film 80. Furthermore, a contact electrode 51 is formed in the interlayer insulating film 82. In the peripheral region 200, a mark 85 (first mark) is previously formed in the interlayer insulating film 82.

Figure 5B:
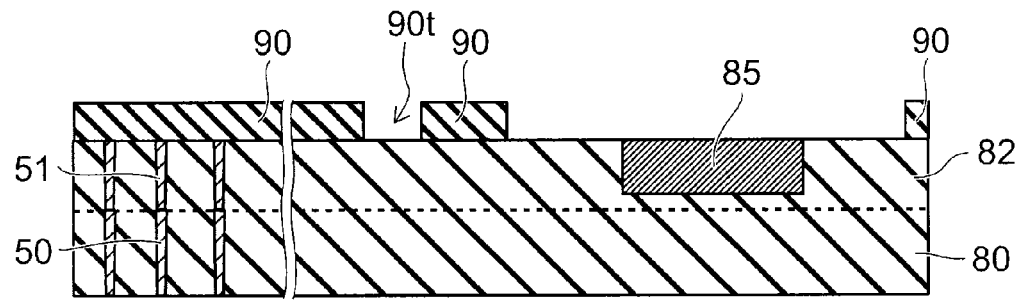

Next, as shown in FIG. 5B, on the interlayer insulating film 82, a mask layer 90 (first mask layer) is formed by photolithography and dry etching. The mask layer 90 covers the interlayer insulating film 82 and the contact electrode 51 in the memory cell region 100. In the peripheral region, the mask layer 90 includes a trench 90t (first trench) extending in a direction (e.g., Y-direction) crossing the Z-direction. At the bottom of the trench 90t, the interlayer insulating film 82 is exposed. The position of the trench 90t is determined based on the mark 85 provided in the interlayer insulating film 82.

Figure 5C:
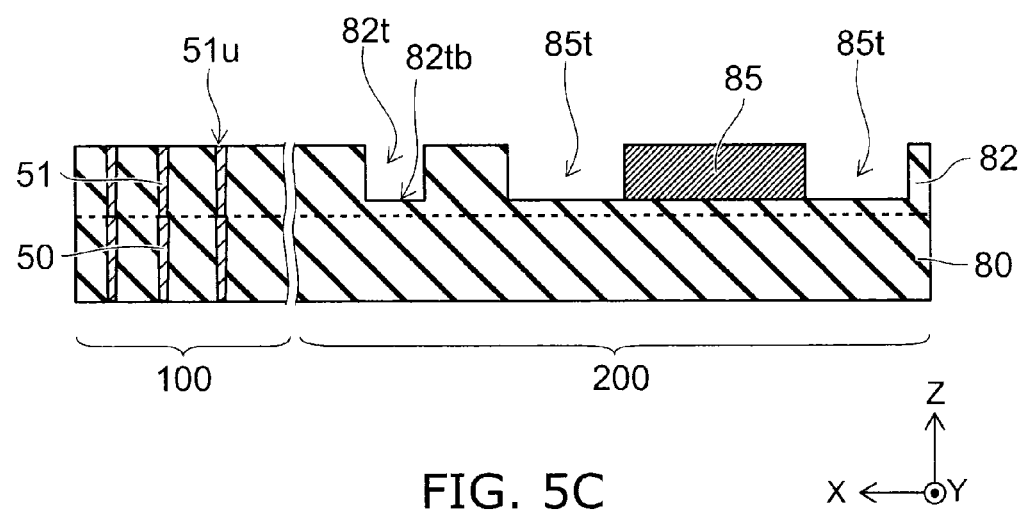

Next, as shown in FIG. 5C, dry etching is performed on the interlayer insulating film exposed from the mask layer 90. The dry etching is e.g. RIE (reactive ion etching). Thus, in the peripheral region 200, a trench 82t (second trench) extending in a direction (e.g., Y-direction) crossing the Z-direction and having a bottom surface 82tb lower than the upper end 51u of the contact electrode 51 is formed.

Here, as an etchant for dry etching, a gas preferentially etching the interlayer insulating film 82 is selected. Thus, this etchant cannot etch the mark 85 different in material from the interlayer insulating film 82. Accordingly, after dry etching, the mark 85 remains, and the interlayer insulating film 82 exposed from the mask layer 90 around the mark 85 is etched. Thus, a trench 85t is formed around the mark 85. The width of the trench 85t is made wider than the width of the trench 82t.

Figure 6A:
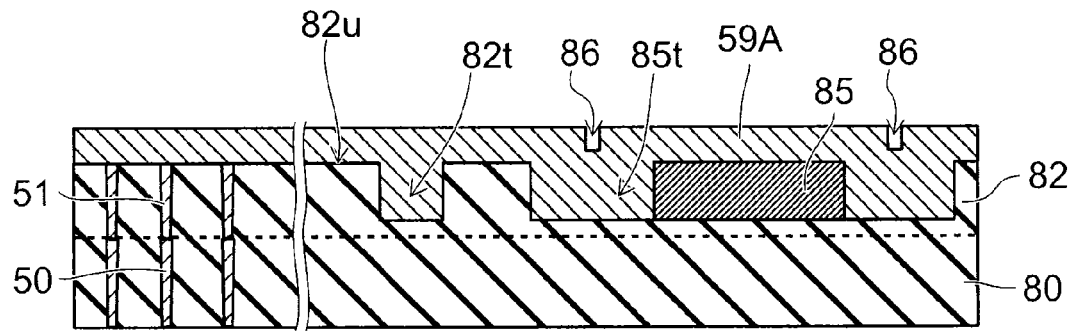

Next, as shown in FIG. 6A, a conductive layer 59A is formed in the trench 82t, on the trench 82t, in the trench 85t, on the trench 85t, on the upper surface 82u of the interlayer insulating film 82, and on the mark 85. The conductive layer 59A is formed by sputtering technique. The material of the conductive layer 59A is e.g. tungsten.

Here, the width of the trench 85t is made wider than the width of the trench 82t. Thus, reflecting the depression structure of the trench 85t, the conductive layer 59A above the trench 85t is not made completely flat, but a depression 86 remains in the conductive layer 59A. This depression 86 is used as a new mark 86 in the subsequent process. That is, in the stage of FIG. 6A, simultaneously with forming the conductive layer 59A, a mark 86 different from the mark 85 is formed in the conductive layer 59A.

Figure 6B:
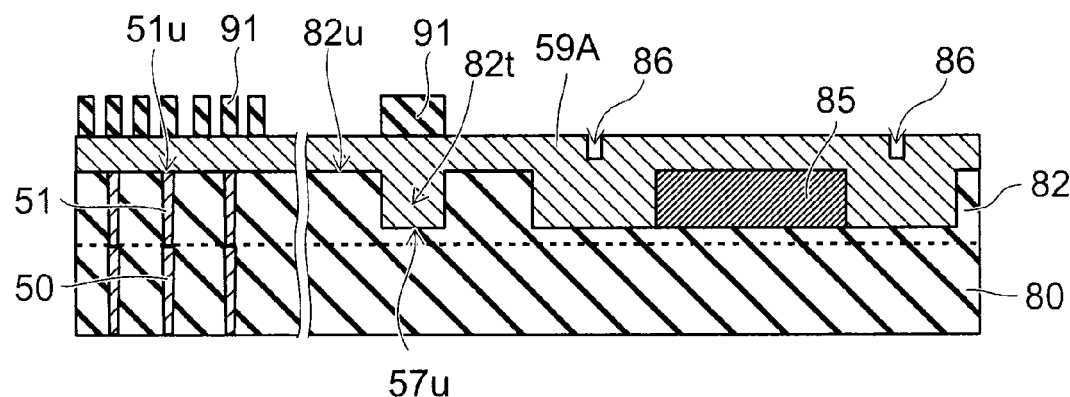

Next, as shown in FIG. 6B, via the conductive layer 59A, a mask layer 91 (second mask layer) covering the upper end 51u of the contact electrode 51 and the conductive layer 59A formed in the trench 82t is formed. The mask layer 91 is formed by photolithography and dry etching.

Here, in the memory cell region 100, the mask layer 91 has a line-and-space pattern extending in the Y-direction. In the peripheral region 200, the mask layer 91 is a line pattern extending in the Y-direction.

In this stage, the mark 85 is covered with the conductive layer 59A. Thus, the mark 85 is not observed by the optical means in photolithography. However, a new mark 86 has been formed in the conductive layer 59A. Thus, the position of the mask layer 91 covering the conductive layer 59A formed in the trench 82t, or the position of the mask layer 91 covering the upper end 51u of the contact electrode 51, can be determined based on the mark 86.

Figure 6C:
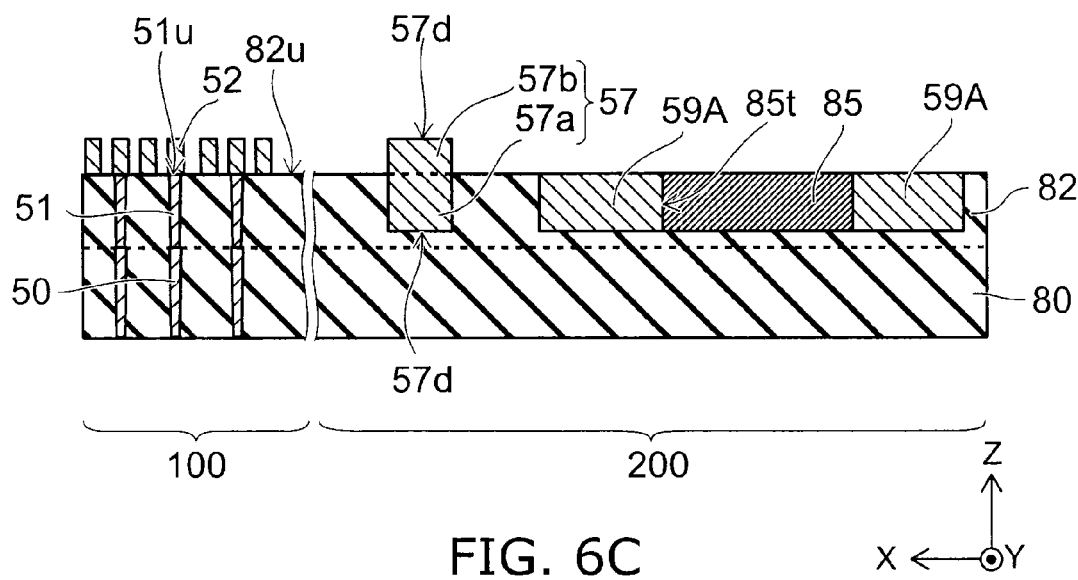

Next, as shown in FIG. 6C, the conductive layer 59A exposed from the mask layer 91 is removed by dry etching (e.g., RIE). The dry etching is continued until the upper surface 82u of the interlayer insulating film 82 is exposed. Subsequently, the mask layer 91 is removed.

After dry etching, a wiring layer 52 is formed in the memory cell region 100, and a wiring layer 57 is formed in the peripheral region 200. The wiring layer 52 is connected to the upper end 51u of the contact electrode 51 and extends in e.g. the Y-direction. The wiring layer 57 extends in e.g. the Y-direction. The upper end 57u of the wiring layer 57 is higher than the upper end 51u of the contact electrode 51. The lower end 57d of the wiring layer 57 is lower than the upper end 51u of the contact electrode 51. The height of the upper end 52u of the wiring layer 52 is equal to the height of the upper end 57u of the wiring layer 57.

The lower end 57d of the wiring layer 57 is lower than the upper end 51u of the contact electrode 51 because the wiring layer 57 is embedded below the upper surface 82u of the interlayer insulating film 82.

The height of the upper end 52u of the wiring layer 52 is equal to the height of the upper end 57u of the wiring layer 57 because the wiring layer 52 and the wiring layer 57 are formed by division from the common conductive layer 59A. Here, in the trench 85t, the conductive layer 59A remains.

In the wiring layer 57, the position of the first portion 57a below the upper surface 82u of the interlayer insulating film 82 is determined by the mark 85. The position of the second portion 57b above the upper surface 82u of the interlayer insulating film 82 is determined by the mark 86. Thus, the first portion 57a and the second portion 57b may be misaligned in the X-direction.

FIGS. 7A to 7C describe the effect of the nonvolatile semiconductor memory device according to the first embodiment.

The wiring layer 57 shown in FIGS. 7A and 7B has no first portion 57a below the upper surface 82u of the interlayer insulating film 82, but has only the second portion 57b. Here, the thickness of the second portion 57b is e.g. 50 nm.

FIG. 7C illustrates the wiring layer 57 of the first embodiment. Here, the thickness of the first portion 57a is e.g. 100 nm. The thickness of the second portion 57b is e.g. 50 nm.

FIG. 7A illustrates the case where the material of the wiring layers 52, 57 is not tungsten (W) but copper (Cu).

The resistivity of copper (Cu) is lower than the resistivity of tungsten (W). Thus, it is considered that low-resistance wiring layers 52, 57 are obtained by using copper (Cu) as the material of the wiring layers 52, 57.

However, with the advance of miniaturization of the memory cell region 100, the line width of the wiring layer 52 reaches the order of several manometers to several tens of nanometers. Then, by what is called the narrow line effect (e.g., the effect of reduced difference between the electron mean free path and the line width of the wiring layer), the effective resistance of the wiring layer 52 becomes equal between in the case of copper (Cu) and in the case of tungsten (W). Furthermore, typically, the wiring layer made of copper (Cu) is formed by plating technique. However, there is a difficulty in which the plating technique has poorer embeddability than sputtering technique.

Thus, after the miniaturization in the memory cell region 100 has advanced, tungsten (W) is selected as the material of the wiring layers 52, 57 and formed by sputtering technique. This state is shown in FIG. 7B.

However, the resistivity of tungsten (W) is approximately five times or more the resistivity of copper (Cu). Thus, if tungsten (W) is selected as the material of the wiring layer 57 having only the second portion 57b, the resistance of the wiring layer 57 is made higher. Then, circuit design in the peripheral region 200 is made difficult. On the other hand, in another approach, copper (Cu) formed by plating technique is used as the material of the wiring layer 57. However, in this case, formation of the wiring layer 52 and formation of the wiring layer 57 are separated and cause cost increase.

In contrast, the wiring layer 57 of the first embodiment shown in FIG. 7C extends into the interlayer insulating film 82 in the first portion 57a as compared with the wiring layer 57 shown in FIG. 7B. For instance, the thickness of the wiring layer 57 shown in FIG. 7C is three times the thickness of the wiring layer 57 shown in FIG. 7B. Thus, the resistance of the wiring layer 57 shown in FIG. 7C is ⅓ times the resistance of the wiring layer 57 shown in FIG. 7B. That is, according to the first embodiment, while miniaturization in the memory cell region 100 is advanced, a low-resistance wiring layer 57 is formed in the peripheral region 200.

Second Embodiment

FIGS. 8A to 9B are schematic sectional views showing a process for manufacturing the nonvolatile semiconductor memory device according to the first embodiment.

FIGS. 8A to 9B show the manufacturing process subsequent to the state shown in FIG. 5C.

Figure 8A:
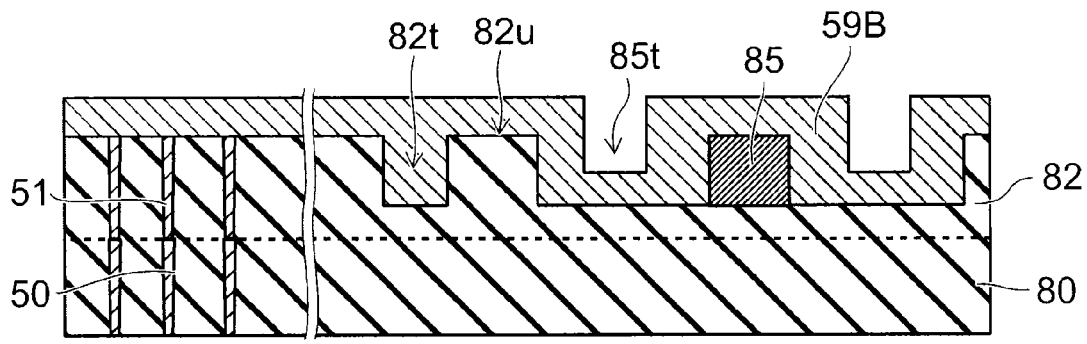
FIGS. 8A to 9B are schematic sectional views showing a process for manufacturing the nonvolatile semiconductor memory device according to the first embodiment.

As shown in FIG. 8A, a conductive layer 59B is formed in the trench 82t, on the trench 82t, in the trench 85t, on the trench 85t, and on the upper surface 82u of the interlayer insulating film 82. The conductive layer 59B is formed by sputtering technique. The material of the conductive layer 59B is e.g. copper.

The conductive layer 59B is formed on the bottom and the inner wall of the trench 85t. However, the trench 85t is not completely filled with the conductive layer 59B, but the trench 85t remains.

Figure 8B:
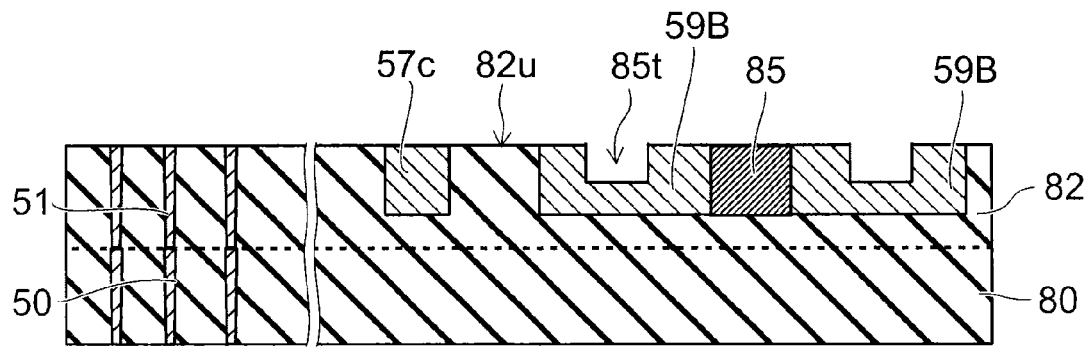

Next, as shown in FIG. 8B, CMP (chemical mechanical polishing) processing is performed on the conductive layer 59B to lower the surface of the conductive layer 59B. Thus, the upper surface 82u of the interlayer insulating film 82 is exposed. By this CMP processing, a wiring layer 57c made of the same material as the conductive layer 59B is formed in the trench 82t. Furthermore, the conductive layer 59B formed in the trench 85t remains around the mark 85. Furthermore, the trench 85t remains in the surface of the conductive layer 59B.

Figure 8C:
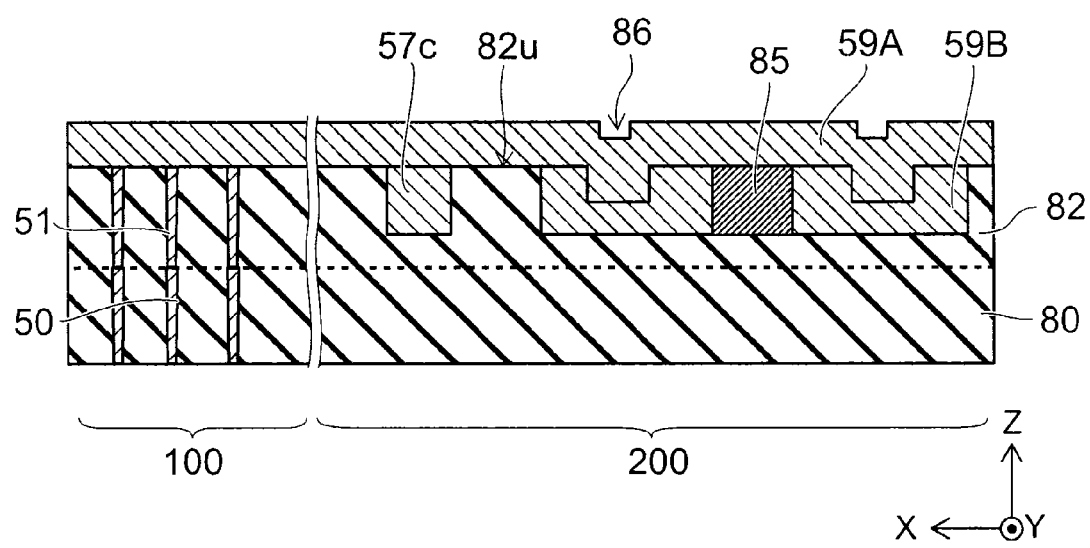

Next, as shown in FIG. 8C, a conductive layer 59A is formed on the wiring layer 57c, on the conductive layer 59B, in the trench 85t, on the trench 85t, on the upper surface 82u of the interlayer insulating film 82, and on the mark 85. The conductive layer 59A is formed by sputtering technique. The material of the conductive layer 59A is e.g. tungsten.

Here, above the trench 85t, the conductive layer 59A is not made completely flat, but a depression 86 remains, reflecting the depression structure of the trench 85t. This depression 86 is used as a new mark 86 in the subsequent process.

Figure 9A:
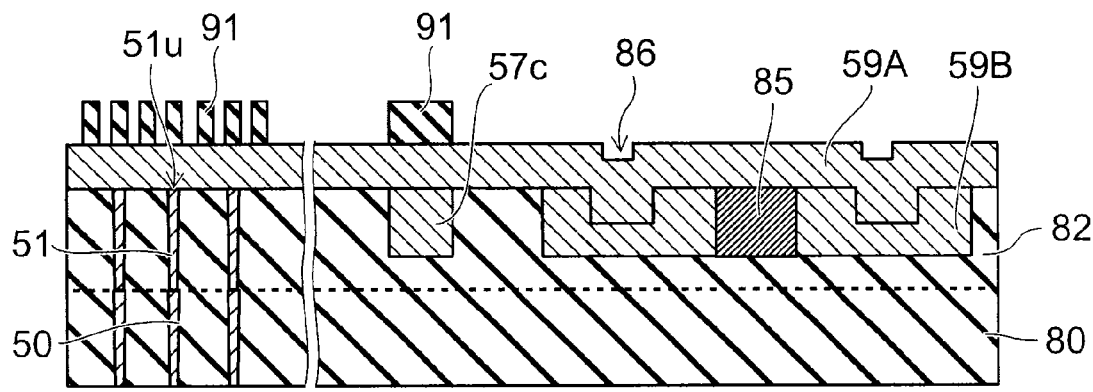

Next, as shown in FIG. 9A, via the conductive layer 59A, a mask layer 91 covering the upper end 51u of the contact electrode 51 and the wiring layer 57c is formed. The mask layer 91 is formed by photolithography and dry etching. The position of the mask layer 91 is determined based on the mark 86.

Figure 9B:
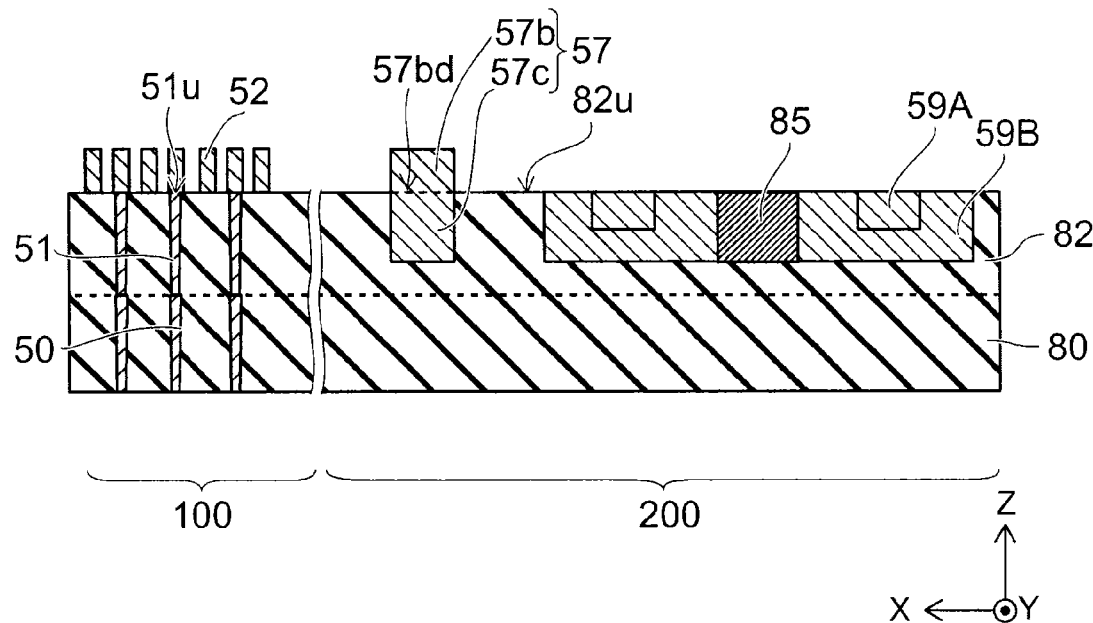

Next, as shown in FIG. 9B, the conductive layer 59A exposed from the mask layer 91 is removed by dry etching (e.g., RIE). The dry etching is continued until the upper surface 82u of the interlayer insulating film 82 is exposed. Subsequently, the mask layer 91 is removed.

After dry etching, a wiring layer 52 is formed in the memory cell region 100, and a wiring layer 57 is formed in the peripheral region 200. The wiring layer 57 includes a first portion 57c (copper) and a second portion 57b (tungsten) different in material from the first portion 57c.

In the wiring layer 57, the position of the first portion 57c below the upper surface 82u of the interlayer insulating film 82 is determined by the mark 85. The position of the second portion 57b above the upper surface 82u of the interlayer insulating film 82 is determined by the mark 86. Thus, the first portion 57c and the second portion 57b may be misaligned in the X-direction. Furthermore, the height of the upper end 51u of the contact electrode 51 from the semiconductor layer 10 is equal to the height of the boundary 57bd between the first portion 57c and the second portion 57b from the semiconductor layer 10.

Thus, in the second embodiment, the first portion 57c of the wiring layer 57 is formed in the trench 82t. Then, on the first portion 57c, a second portion 57b different in material from the first portion 57c is formed. The wiring layer 57 includes the first portion 57c having a lower resistivity than the second portion 57b. Thus, the resistance of the wiring layer 57 is further reduced.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
    a semiconductor layer provided in a memory cell region and a peripheral region at a periphery of the memory cell region;
    an interlayer insulating film provided above the semiconductor layer;
    a plurality of element separating regions separating the semiconductor layer into a plurality of semiconductor regions in the memory cell region;
    a gate electrode provided on one of the plurality of semiconductor regions via a gate insulating film in the memory cell region;
    a plurality of first contact electrodes extending in a first direction from the semiconductor layer toward the interlayer insulating film in the memory cell region, and one of the first contact electrodes being connected to the one of the plurality of semiconductor regions in the memory cell region;
    a plurality of first wiring layers extending in a second direction crossing the first direction in the memory cell region, and one of the first wiring layer layers being connected to an upper end of the one of the first contact electrodes in the memory cell region;
    a second contact electrode extending in the first direction from the semiconductor layer toward the interlayer insulating film in the peripheral region, and the second contact electrode being connected to the one of the plurality of semiconductor regions in the peripheral cell region; and
    a second wiring layer extending in a third direction crossing the first direction in the peripheral region, the second wiring layer being electrically connected to an upper end of the second contact electrode in the peripheral cell region, the second wiring layer having an upper end higher than the upper end of the first contact electrodes, the second wiring layer having a lower end lower than the upper end of the first electrodes, wherein
    a ratio of a first width of a first wiring layer lower end of the one of the first wiring layers cut perpendicularly through the first wiring layer lower end to a second width of a first contact electrode upper end of the one of the first contact electrodes cut perpendicularly through the first contact electrode upper end is smaller than a ratio of a third width of a second wiring layer lower end of the second wiring layer cut perpendicularly through the second wiring layer lower end to a fourth width of a second contact upper end of the second contact electrode cut perpendicularly through the second contact upper end.

2. The device according to claim 1, wherein the first width is narrower than the second width, and
    the third width is wider than the fourth width.

3. The device according to claim 1, wherein a first height of an upper end of the one of the first wiring layers from the semiconductor layer is equal to a second height of the upper end of the second wiring layer from the semiconductor layer.

4. The device according to claim 1, wherein the lower end of the second wiring layer is located between the upper end and a lower end of the one of the first contact electrodes.

5. The device according to claim 1, wherein the second wiring layer includes a first portion and a second portion provided on the first portion, and the second portion including a material different from a material of the first portion.

6. The device according to claim 5, wherein a first height of the upper end of the one of the first contact electrodes from the semiconductor layer is equal to a second height of boundary between the first portion and the second portion from the semiconductor layer.

7. The device according to claim 5, wherein the first portion includes copper and the second portion includes tungsten.

8. The device according to claim 1, wherein the second direction and the third direction are parallel or cross to each other.

9. The device according to claim 1, wherein shape of the second wiring layer cut perpendicularly to the third direction is rectangular.

10. The device according to claim 1, wherein one of the first wiring layers includes tungsten, and the second wiring layer includes tungsten.

11. The device according to claim 1, wherein the upper end of the second wiring layer has substantially same height to an upper end of the first wiring layers electrodes.

12. The device according to claim 1, wherein one of the first wiring layers is coupled to series-connected memory cells via the one of the first contact electrodes.

13. A method for manufacturing a nonvolatile semiconductor memory device, comprising:
    forming an interlayer insulating film above a semiconductor layer provided in a memory cell region and a peripheral region at a periphery of the memory cell region;
    forming a contact electrode extending in a first direction from the semiconductor layer toward the interlayer insulating film, the contact electrode having a side face in contact with the interlayer insulating film, and the contact electrode electrically connected to a first element provided on the semiconductor layer in the memory cell region;
    forming a first mask layer covering the interlayer insulating film and the contact electrode in the memory cell region, and the first mask layer including a first trench extending in a third direction crossing the first direction and exposing the interlayer insulating film from the first trench on the interlayer insulating film in the peripheral region;
    forming a second trench extending in the third direction crossing the first direction by etching the interlayer insulating film exposed from the first mask layer, and the second trench having a bottom surface lower than an upper end of the contact electrode in the interlayer insulating film in the peripheral region;
    forming a conductive layer in the second trench, on the second trench, and on an upper surface of the interlayer insulating film;
    forming a second mask layer covering the upper end of the contact electrode and the conductive layer formed in the second trench via the conductive layer;
    forming a first wiring layer and a second wiring layer by removing the conductive layer exposed from the second mask layer, the first wiring layer connected to the upper end of the contact electrode and extending in a second direction crossing the first direction in the memory cell region, the second wiring layer extending in the third direction crossing the first direction, the second wiring layer having an upper end higher than the upper end of the contact electrode, the second wiring layer having a lower end lower than the upper end of the contact electrode, and the second wiring layer having a side face at least partly in contact with the interlayer insulating film in the peripheral.

14. The method according to claim 13, wherein in forming the second trench, position of the first trench is determined based on a first mark provided in the interlayer insulating film in the peripheral region.

15. The method according to claim 13, wherein in forming the conductive layer, a second mark is formed in the conductive layer in the peripheral region.

16. The method according to claim 15, wherein in forming the second mask layer, position of the second mask layer covering the conductive layer formed in the second trench is determined based on the second mark.

17. The method according to claim 15, wherein in forming the conductive layer, a surface of the conductive layer is lowered until the upper surface of the interlayer insulating film is exposed, and another conductive layer different in material from the conductive layer is formed on the conductive layer after forming the conductive layer in the second trench, on the second trench, and on the upper surface of the interlayer insulating film.

* * * * *